(12) United States Patent
Mollard et al.

(10) Patent No.: US 9,269,739 B2
(45) Date of Patent: Feb. 23, 2016

(54) ACCESS-RESISTANT DIODE ARRAY DEVICE HAVING ENHANCED STABILITY

(71) Applicant: Commissariat a l'energie atomique et aux ene alt, Paris (FR)

(72) Inventors: Laurent Mollard, Seyssinet-Pariset (FR); Nicolas Baier, Biviers (FR); Johan Rothman, Lan-en-Vercors (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/361,177

(22) PCT Filed: Nov. 26, 2012

(86) PCT No.: PCT/EP2012/073632
§ 371 (c)(1),
(2) Date: May 28, 2014

(87) PCT Pub. No.: WO2013/079447
PCT Pub. Date: Jun. 6, 2013

(65) Prior Publication Data
US 2014/0339570 A1    Nov. 20, 2014

(30) Foreign Application Priority Data
Nov. 28, 2011   (FR) ..................... 11 03618

(51) Int. Cl.
*H01L 27/146* (2006.01)
*H01L 31/032* (2006.01)
(52) U.S. Cl.
CPC ...... *H01L 27/14649* (2013.01); *H01L 27/1463* (2013.01); *H01L 27/14603* (2013.01); *H01L 27/14636* (2013.01); *H01L 27/14643* (2013.01); *H01L 27/14696* (2013.01); *H01L 31/0324* (2013.01)

(58) Field of Classification Search
None
See application file for complete search history.

(56) References Cited

U.S. PATENT DOCUMENTS

| 2005/0082630 | A1 | 4/2005 | Yamanaka |
| 2007/0075344 | A1 | 4/2007 | Yamanaka |
| 2010/0117183 | A1* | 5/2010 | Rothman et al. .............. 257/443 |
| 2010/0148289 | A1 | 6/2010 | McCarten et al. |
| 2011/0096208 | A1 | 4/2011 | Roy et al. |

(Continued)

FOREIGN PATENT DOCUMENTS

| EP | 1 677 353 | 7/2006 |
| EP | 2 315 251 | 4/2011 |

OTHER PUBLICATIONS

U.S. Appl. No. 14/359,216, filed May 19, 2014, Mollard, et al.
U.S. Appl. No. 14/282,072, filed May 20, 2014, Mollard, et al.
M.A. Kinch, et al., "1/f Noise in HgCdTe Photodiodes", Journal of Electronic Materials, vol. 34, No. 6, (2005), pp. 928-932.

(Continued)

*Primary Examiner* — Khaja Ahmad
(74) *Attorney, Agent, or Firm* — Oblon, McClelland, Maier & Neustadt, L.L.P.

(57) ABSTRACT

A device includes a substrate carrying an array of diodes, organized in rows and columns, and a peripheral substrate contact is arranged on at least one side of the array. The substrate includes one or more buried conducting lines electrically connected to the peripheral substrate contact and being positioned between at least two neighboring columns of diodes and/or between at least two neighboring rows of diodes.

14 Claims, 9 Drawing Sheets

(56) References Cited

U.S. PATENT DOCUMENTS

2011/0227091 A1    9/2011  Toda
2012/0146174 A1*   6/2012  Zeman et al. ............... 257/446

OTHER PUBLICATIONS

J.M. Arias, et al., "MBE HgCdTe Heterostructure p-on-n Planar Infrared Photodiodes", Journal of Electronic Materials, vol. 22, No. 8 (1993), pp. 1049-1053.

Li, S. S., "Heavy Doping effects in a degenerate semiconductor", Semiconductor Physical Electronics, Total 3 Pages, (Jan. 1, 2006) XP055049276.
International Search Report Issued Jan. 24, 2013 in PCT/EP12/073632 Filed Nov. 26, 2012.
U.S. Appl. No. 14/795,129, filed Jul. 9, 2015, Mollard, et al.
U.S. Appl. No. 14/758,707, filed Jun. 30, 2015, Rothman.
U.S. Appl. No. 14/686,084, filed Apr. 14, 2015, Mollard, et al.
U.S. Appl. No. 14/705,078, filed May 6, 2015, Mollard, et al.

* cited by examiner

ACCESS-RESISTANT DIODE ARRAY DEVICE HAVING ENHANCED STABILITY

TECHNICAL FIELD

The present invention relates to the field of diodes manufactured on semi-conductor substrates and arranged in an array of diodes. The invention more precisely concerns p/n or n/p type diodes which can be used for imagers in the visible or infrared range.

STATE OF PRIOR ART

In numerous applications, diodes are arranged in arrays of diodes present on a substrate. In an array, the diodes are arranged into rows and columns.

An array of diodes can be used to enable an electromagnetic radiation to be detected. Indeed, electron-hole pairs can be formed by interaction between the electromagnetic radiation and the substrate. This enables a current proportional to an intensity of the incident radiation to occur. Each diode then forms a pixel of an imager. It is thus possible to manufacture imagers in the visible range or infrared imagers.

Conversely, such an array can be used to emit an electromagnetic radiation when a current flows in each diode such that the array forms an image. Each diode is then a pixel of a screen or display, or part of a pixel if each pixel consists of several electromagnetic radiation emitters.

There are several types of arrangements depending on whether the diodes are locally arranged according to a four order axial symmetry or a six order axial symmetry.

FIG. 1A represents a 4 order arrangement of an array including diodes Di. Each diode Di is at the intersection of a row L and a column C which, with the row, is at an angle of 90° in the array plane. The diodes Di of a row L are aligned with the diodes of another neighbouring row L, thus forming the columns C. In FIG. 1A, a row L0 and a column C0 are boxed, the diode called D0 is at the intersection of the boxed row L0 and of the boxed column C0. This configuration is conventional and known, this is the one which will be used for the description of the invention for simplifying purposes. The diodes of a same row L are separated from each other by a row pitch P1. The diodes of a same column C are separated from each other by a column pitch P2. These pitches are called "majority" row pitches and majority column pitches as opposed to one or more "extended" pitches introduced later. If the majority row pitch and the majority column pitch are substantially identical, then a pixel pitch could be used in place of both abovementioned pitches.

FIG. 1B illustrates an arrangement of diodes into an array according to a 6 order axial symmetry. In this example, the diodes D are arranged into rows L'. From one row L' to another neighbouring row, the diodes Di are not aligned, but offset from each other. Thus, a diode Di of a row L' is facing two diodes Di of a neighbouring row L'. Such an arrangement does not form columns of diodes Di, but a first diagonal H1 of diodes and a second diagonal H2 of diodes having, in the array plane, a given alpha angle between them. Here, the first diagonals H1 are represented going from top left to bottom right of FIG. 1B whereas the second diagonals H2 are represented going from bottom left to top right. Thus, the diode referenced D1 is at the intersection of a row L1 of a first diagonal H11 and a second diagonal H21 forming a given alpha angle between them. The given alpha angle can be substantially equal to 60°. Then the alpha angle also separates the rows L' of the first and second diagonals H1, H2.

This arrangement of diodes will not be particularly described in the continuation of the document. However, the invention could be applied thereto, the notions of rows and columns in the continuation of the description having then to be replaced by the notions of rows, first diagonal and second diagonal.

A p/n, or n/p diode, 10.0 as illustrated in FIG. 2, is present on a substrate 1.0 of a semi-conductor material. In the substrate 1.0, a first doped zone, with a first doping type formed by most of the substrate and second doped zone 2.0 including a dopant forming a second doping type can be distinguished, the second doping type being opposite to the first doping type, respectively p or n for a p/n diode or an n/p diode. Generally, the second doped zone 2.0 is doped with a higher doping density, of several orders of magnitude, than the dopant forming the first doping type in the substrate 1.0. The second doped zone 2.0 forms a p/n junction or n/p junction with the substrate 1.0. It will be considered that the diode 10.0 corresponds to the p/n junction, the second doped zone 2.0 and a substrate zone present around the second doped zone 2.0 and extending on at least a few nanometers.

Within the doped zone 2.0, a diode contact 34.0 enables any current flowing in the diode 10.0 to be provided or recovered. The diode contact 34.0 comprises a foot 3.0 which sinks into the second doped zone 2.0 and a head 4.0 which allows an electrical contact between the foot 3.0 and an external electrical connection not represented.

A passivation layer 9.0 is generally present between the substrate 1.0, the first and second doped zones together, and the head 4.0 of the diode contact 34.0. Otherwise, there can be an electrical contact between the diode contact 34, the second doped zone 2.0 and the first doped zone of the substrate 1.0. This would result in short-circuiting the diode.

Whether the diode 10.0 is used in detection or emission, it is necessary that a current can flow therein. To enable the diode 10.0 to be biased, it is necessary, in addition to the diode contact 34.0 present in the doped zone 2.0, to provide a substrate contact 5.0 in a substrate part external to the diode 10.0.

The substrate contact 5.0 is intended to be connected to an external electric circuit and enables a bias of the diode 10.0 to be imposed. The diode contact 34.0 and the substrate contact 5.0 thus form two terminals of the diode 10.0

When there are several diodes Di arranged in an array, for example as illustrated in FIG. 3A, the substrate contact is generally in the periphery of the array 20 and shared among all the diodes Di of the array 20, it is then called peripheral substrate contact 5.1. This can for example be a conducting line bordering one, two, three or four sides of the array 20, if the latter defines a rectangle or square in the array plane. Here, the peripheral substrate contact 5.1 is formed by a conducting line extending on both sides of the array 20.

The majority row pitch and the majority column pitch are referenced P1 and P2 respectively.

FIG. 3B is a cross-section view along an axis AA' of FIG. 3A directed along a column, wherein only a single diode D1 of the column and part of the peripheral substrate contact 5.1 are represented. The diode D2 includes a doped zone 2.0 present in the substrate 1.0 and a diode contact 34.0 penetrating the doped zone 2.0. The diode contact 34.0 of the diode D2 is located at a given distance of the peripheral substrate contact 5.1, called inter-contact border distance L4.

To use the diodes, they should be biased as already mentioned. The bias of the diode contact 34.0 is performed by a reading circuit (not represented) in contact with a metallization present above all the diodes. A substrate bias is performed by the reading circuit on the peripheral substrate contact 5.1 present around the array.

A potential difference formed between the peripheral substrate contact 5.1 and the diode contact 34.0 is applied to the material of the substrate 1.0 on the inter-contact border distance L4. The material of the substrate 1.0 forms a border parasitic resistance R1 on the distance L4 when a current flows in the substrate between the diode and the peripheral substrate contact 5.1. This parasitic resistance R1 can be considered as in series with the diode D2.

FIG. 3C represents a detail of FIG. 3A, the diode D2 is represented as well as two neighbouring diodes, one on the same row and the other on the same column, enabling the row pitch P1 and the column pitch P2 to be illustrated. The peripheral substrate contact 5.1 is formed by two contact branches, a first contact branch 5.2 along the rows and a second contact branch 5.3 along the columns. The diode D2 is in series with a first border parasitic resistance R2 connecting it to the first contact branch 5.2 and a second border parasitic resistance R3 connecting it to the second contact branch 5.3. Both border parasitic resistances R2 and R3 are mounted in parallel. The border parasitic resistance R2 represents the current flowing through the substrate between the diode D2 and the first contact branch 5.2 on a first inter-contact border distance L2. The border parasitic resistance R3 represents the current flowing through the substrate between the diode D2 and the second contact branch 5.3 on a second inter-contact border distance L3.

Due to the non-zero parasitic resistances R1, R2, R3 and different values depending on the diodes, there is observed an unbias of diodes located more in the centre of the array than diodes closer to the peripheral substrate contact. This unbias will be all the stronger as the array is of a great format or as the substrate is of a more resistive material. Not all the diodes of the array will therefore undergo the same potential difference. Consequently, the diodes, as a function of their position on the array, will have different responses. In particular, the diodes the most in the centre of the array could be completely unbiased.

The most unbiased diodes Di will generally have a reduced performance, for example a reduced efficiency. If the diodes are light emitting, they could emit with a lower light intensity. If the diodes are light receiving, they could have a weakened measuring current upon interacting with an electromagnetic radiation, or even a zero current.

In other words, because of this unbias, the diodes of the edge and those of the centre of the array will not have the same response for a same incident electromagnetic radiation.

In particular, when the inter-contact distances L2, L3 between the diode D2 and the peripheral substrate contact 5.1 each have a value close to 20 or 30 or 50 times the value of the row pitch P1 or column pitch P2, the parasitic resistances become significant if they are higher than a critical resistance. The inter-contact distance resulting in a parasitic resistance having a value equal to the critical resistance is called the inter-contact critical distance.

For inter-contact distances L2, L3 close to 100 or 500 times the row pitch P1 or column pitch P2, it can be considered that the inter-contact distances L2, L3 are too high and induce a total unbias of some diodes. A particular consequence can be to have to increase a supply voltage applied between the diode contact 34.0 and the substrate contact 5.1, which is not always possible.

Those skilled in the art are able to overcome any difficulty generated by the parasitic resistances, to form closer substrate contacts within the array.

The idea underlying the use of closer substrate contacts 46 is illustrated in FIGS. 4A and 4B. On a substrate 41.0 multiple diodes Di, Dj, $D_A$, $D_B$ are present, arranged in an array. FIG. 4A illustrates a cross-section view of the array, and FIG. 4B a top view thereof. It is assumed that the diodes Di of FIG. 4A belong to a same row, they could however be on a same column. In addition, all the diodes Di are not represented, only those making it possible to understand the principle of closer substrate contacts 46 are present in the figure.

Each diode Di includes a doped zone 42.0 present in the substrate 41.0 and a diode contact 44.0 including a head extending in the abovementioned passivation layer 49, on top of the doped zone 42.0 and possibly on top of the substrate 41.0 and a foot penetrating the doped zone 42.0. Moreover, a dielectric layer 48, of dielectric material, covers the substrate 41.0 and the heads of the diode contacts 44.0. In the continuation of the invention, for simplifying purposes, the passivation layer 49 is considered as being present, even it is not represented, unless otherwise expressly indicated.

For most diodes Di, a majority row pitch P is provided, enabling a periodicity to be measured in the arrangement of the diodes Di at the surface of the substrate 41.0 in a same row.

A peripheral substrate contact 45.0 has been represented in a cross-section view on the right at the end of the row of diodes.

Between two specific diodes, designated hereinafter as being a first diode $D_A$ and a second diode $D_B$, is inserted a closer substrate contact 46. The closer substrate contact 46 is for example a conducting pad, generally of metal, having a part penetrating the substrate 41.0. The closer substrate contact 46 is located at a minimum distance W from each of the diodes $D_A$, $D_B$, which surround it. The minimum distance W is preferably in the same order of magnitude as an inter-diode distance W' between two neighbouring diodes Di. As a first approximation, a closer substrate contact 46 can have dimensions in the same order of magnitude as the diode contacts 44.0, or it can have slightly lower or higher dimensions. However, the presence of the closer substrate contact 46 induces that the first and second diodes $D_A$, $D_B$ surrounding the closer substrate contact 46 are preferentially spaced apart by an extended pitch $P_{AB}$ higher than the majority row pitch P between two neighbouring diodes Di in the rest of the row.

The closer substrate contact 46 is connected to the peripheral substrate contact 45.0 by means of an electrical connection 47, for example an interconnection, which is positioned so as not to electrically connect any diode contact 44.0. This electrical connection is made in or on the dielectric layer 48.

Each given diode Dj is at an inter-contact border distance L5j from the branch of the peripheral substrate contact 45.0 and at an inter-contact inner distance L6j from the closer substrate contact 46. The closer substrate contact 46 is positioned such that for each diode, at least one of the inter-contact border distance L5j or the inter-contact inner distance L6j is lower than the inter-contact critical distance defined above. The inter-contact critical distance can vary as a function of the microelectronics technology used, or as a function of a targeted application, the material of the substrate, a voltage applicable between the diode contacts 44.0 and either the branches of the peripheral substrate contact 45.0, or the closer substrate contacts 46, etc.

FIG. 4B illustrates the array 20.4 of diodes Di including at the periphery a peripheral substrate contact 45.0 formed by four contact branches, designated under the references 45.1, 45.2, 45.3 and 45.4 respectively. Since the array 20.4 is rectangular or square, it has four sides, and each side of the array 20.4 is bordered by one of the contact branches. In the array

20.4, all the diodes Di are not represented. Only the diodes necessary for the understanding are represented.

In particular, the array 20.4 consists of rows and columns of diodes Di, each diode Di located at the intersection of a row and a given column having at least one neighbouring diode in the same column and a neighbouring diode in the same row. Most of the diodes Di are periodically arranged according to the rows with a majority row pitch P1 and according to the columns with a majority column pitch P2 with their neighbouring diodes.

The array 20.4 consists of a number of rows and columns of diodes such that at least one diode Dj has an inter-contact border distance L5j between its diode contact and all the branches 45.1, 45.2, 45.3, 45.4 higher than the inter-contact critical distance.

In a location of the array 20.4, for example at the intersection of two rows LA and LB and two neighbouring columns CA and CB, is inserted a closer substrate contact 46. The closer substrate contact 46 can be sandwiched between two neighbouring diodes of a same row, or between two neighbouring diodes of a same column. It is therefore respectively present between both columns or between both rows. Alternatively, as illustrated in FIG. 4B, the closer substrate contact 46 can be located at the intersection of a pair of rows with a pair of columns.

When the closer substrate contact 46 is between two diodes DAA and DBA or DAB and DBB of a same row, the extended pitch P1AB between both said diodes is higher than the majority row pitch P1 of the array.

When the closer substrate contact 46 is between two diodes DAA and DAB or DBA and DBB of a same column, the extended pitch P2AB between both said diodes is higher than the majority column pitch P2 of the array.

In FIG. 4B, the closer substrate contact 46 is represented at the intersection of a pair of rows LA, LB and a pair of columns CA, CB. Consequently, the array 20.4 includes at least two high disturbances of arrangement periodicity of the diodes Di by closer contact 46 present in the array, one between the rows LA and LB and the other between the columns CA and CB. The rows LA, LB and the columns CA, CB have between them an extended pitch P1AB, P2AB, these pitches are higher than the majority row pitch P1 and the majority column pitch P2, respectively.

The closer substrate contact 46, as in the example of FIG. 4A, is at a minimum distance W from any neighbouring diode. Moreover, the closer substrate contact 46 is inserted in the array 20.4 such that, for any given diode Dj of the array, there is at least one distance, from an inter-contact border distance L5j and an inter-contact inner distance L6j, which is lower than the inter-contact critical distance.

If it is not possible, with regard to the dimensions of the array 20.4, that a single closer substrate contact 46 leads to such a result, generally several closer substrate contacts 46 are introduced. Thus, usually, the closer substrate contacts 46 are inserted as a network in the arrays of diodes 20.4. This network is generally dense. If the inter-contact critical distance is for example assessed at 15 pixel pitches, it is then necessary, to take diagonal effects into account, to have closer substrate contacts 46 approximately every 20 diodes.

If such is the case, then there are in the array 20.4 several disturbances of the arrangement periodicity of the diodes Di. However, if several closer substrate contacts 46 are aligned, for example between two same rows or between two same columns, one of the periodicity disturbances is commonly induced by said closer substrate contacts.

An array 20.4 including closer substrate contacts 46 has a better performance, with a more homogeneous response, than a smaller array that does not need closer substrate contacts 46, but including fewer diodes. Such an array 20.4 also has a better performance than an array having the same dimensions not having closer substrate contacts. Indeed, the latter has some less efficient diodes, that is giving, for a same signal, a weaker response than other diodes. However, an array 20.4 including closer substrate contacts 46 includes periodicity defects as stated above.

In the case of microelectronic technologies producing arrays having a high pitch, for example higher than 15 μm, the extended pitches caused by inserting closer substrate contacts 46 can, under some conditions, be assimilated to the pixel pitch. However, within the scope of arrays having a pixel pitch equal to or lower than 15 μm, it is no longer possible to insert closer substrate contacts 46 without the difference between the extended pitches P1Ab and P2AB and the majority pitches becoming too high and significant.

If the array is an imager, these defects, coming from a disturbance of the arrangement periodicity of the diodes, need to be compensated for by calculation so as to observe an electromagnetic image and to transmit a consistent representation thereof. If the array is an emitter, for example a screen, the periodicity disturbance can produce images of reduced quality or which require once again higher signal processings to mask the disturbance.

Moreover, the periodicity disturbance results in forming an array having a reduced density of diode integration. Indeed, the more closer substrate contacts in a given surface are introduced, the more the neighbouring diodes having between them an extended pitch higher than the pitch of the array and the fewer diodes integrated per unit surface.

Finally, the closer substrate contacts 46 require to be connected to the peripheral substrate contact 45.0 by means of the abovementioned electrical connections 47. These interconnections hinder the dielectric layer 48 and make manufacturing of the reading circuit necessary to bias each diode contact 44.0 more difficult.

A means for avoiding, or reducing the periodicity disturbance is to introduce each closer substrate contact in replacement of a diode Di. Such an assembly would made it possible to avoid that some rows and or columns be far from a neighbouring row or column by more than the row pitch or the column pitch. However, such an assembly once again introduces a defect in the electromagnetic image observed or emitted, at least one diode lacking inside the array. To do this, either a closer substrate contact 46 can be created fully, or a diode Di already formed can be used, and directly connect the diode contact 44.0 thereof to a branch 45.1, 45.2, 45.3, 45.4 of the peripheral substrate contact 45.0. In both cases, a surface corresponding to the diode Di is not usable for emitting or receiving an electromagnetic wave.

Furthermore, when a substrate contact is manufactured, some methods used to that end can damage diodes located in the proximity of the substrate contact. These damaged diodes then include defects which result in a reduced performance.

Finally, the interface between the substrate and the insulating dielectric layer is a key parameter of the performance of the diodes. The performance of the diodes is influenced by an interaction of minority carriers with defects forming shallow electronic states, which introduce carrier generation/recombination effects, or with deep electronic states, which introduce charge effects in the dielectric layer.

The shallow electronic states inducing a generation/recombination of carriers present in the space charge zone which extends around the aforesaid p/n junction, give rise to leakage currents.

The shallow electronic states inducing a generation/recombination of carriers present outside of said space charge zone form a higher diffusion dark current and a slower response of the diode.

The charge effects introduce a modulation of the interaction of the carriers with the electronic states inducing a carrier generation/recombination. This results in a response modulation of the diode and of the dark current. This modulation introduces in the array a time noise, often of the 1/f type. Said modulation also introduces an average response variation of the diodes, during a diode temperature variation for several duty cycles. This average response variation is also called cycling noise.

The charge effects can even induce a variation in the dimensions of the space charge zone, for example by moving the space charge zone away from either side of the p/n junction. These variations in the space charge zone can also give rise to time noises, space noises and cycling noises as described in document "1/f noise in HgCdTe Photodiodes" by M. A. Kinch et al published in 2008 in Journal of electronic Material, volume 34, number 6, from pages 928.

In the case of photodiodes with a substrate having a constant band gap, it is attempted to reduce the charge effects at the interface between the symbol and the dielectric layer by optimizing a doping present in the substrate and by attempting to obtain a dielectric layer having a better quality.

However, these options are inefficient ones and the charge effects at the interface remain a significant problem for producing photodiodes with a good yield.

The charge effect at the interface can however be reduced by using heterostructures wherein, in the proximity of the interface, a material having a higher band gap than the rest of the substrate is used, as described in the document "MBE HgCdTe Heterostructure p-on-n Planar Infrared Photodiodes" by J. M. Arias et al in 1993 in Journal of electronic Material, volume 22, number 8, from pages 1049. A higher band gap enables the interaction of minority carries with the interface to be decreased, which enables carrier generation/recombination to be reduced. This method is only applicable for p/n diodes.

For n/p diodes, the only solution is to increase in surface the doping density in the first doped zone of the substrate to displace the Fermi level thereof. This construction is not ideal but it is also applicable to p/n diodes. A defect of this type of heterostructure by doping a surface region of the substrate is that the diode is partly surrounded by this high doping zone, with the result that the risks of leakage current are increased. Therefore, there can be a high yield loss.

These heterostructures however remain sensitive to variations in the dimensions of the space charge zone, even if they can be less sensitive thereto. Moreover, by manufacturing the heterostructures, further defects generally are introduced at the interface between the material of the substrate and the higher band gap material.

DISCLOSURE OF THE INVENTION

The invention aims at reducing the general defect of parasitic resistances, avoiding the unbias of diodes farthest from the substrate contact and thus enabling arrays of diodes having great dimensions to be produced.

The invention also aims at stabilizing the interface by decreasing the charge effects. The charge effects are located at the main surface of the substrate where the diodes are present, or at an interface between the substrate and a dielectric layer covering the substrate and the diodes.

The invention also aims at removing or reducing periodicity disturbances induced by introducing closer substrate contacts.

The invention also aims at decreasing the interaction of minority carriers with the interface by creating a heterostructure following an ion implantation.

To achieve this, the invention relates to a device including a substrate carrying an array of diodes, organized into rows and columns, and a peripheral substrate contact arranged on at least one side of the array, the substrate having a first doping type and the diodes include in the substrate, a second doped zone having a second doping type, opposite to the first type, characterised in that the substrate further includes several other doped zones, each forming a buried conducting line, these other doped zones having the first doping type and a greater doping density than the substrate, the buried conducting lines having a band gap higher than that of the substrate. The buried conducting lines are electrically connected to the peripheral substrate contact, positioned between two neighbouring columns of diodes and/or between two neighbouring rows of diodes and cross at an intersection forming a meshing of buried conducting lines.

In this way, it is well understood that for each diode, the perceived parasitic resistance is distributed into two components, a parasitic resistance formed between said diode and a buried conducting line, and a parasitic resistance formed by the buried conducting line, measured between the peripheral substrate contact and a point of the buried conducting line located as close as possible to the diode. Since the buried conducting lines are conducting, they have a better conductivity than the substrate and have a lesser contribution to the parasitic resistance than the substrate on a same distance. Moreover, by being conducting, the buried conducting lines allow a first mode of action to stabilize the interface by decreasing the charge effects. The charge effects are located at a main surface of the substrate where the diodes are located, or at an interface between the substrate and a dielectric layer covering the substrate and the diodes.

The fact that the buried conducting lines then have a doping of a type opposite to that of the second doped zones of the diodes is advantageous. This allows another mode of action to stabilize said interface.

It is reminded that the band gap of a material is defined as the energy difference between the top of the valence band and the bottom of the conduction band. Within the scope of degenerate semi-conductor material, the conductivity and mobility of carriers are of the same order of magnitude as those of a metal.

In a degenerate semi-conductor material, the Fermi level is located in a band from the conduction band and the valence band and the position is a function of doping. If the doping is of n+ type, the Fermi level is located in the conduction band. An effective band gap is defined which is the energy difference between the Fermi level located in the conduction band and the state corresponding to the direct transition in the valence band which at the first order can be assimilated to the top of the valence band.

Within the scope of the p+ doped material, because of the low curvature of the valence band, the band gap and the effective band gap can be assimilated to the first order.

In the present invention, the term "band gap" is employed in its usual meaning set out above for non-degenerate semi-conductor materials and it encompasses the effective band gap in the case of a degenerate semi-conductor material, above all for n+ doped semi-conductor materials.

If the buried conducting lines have a higher band gap than the surrounding material, this creates a potential barrier at the buried conducting lines.

Thanks to the meshing, there can be conduction paths from a diode to the peripheral substrate contact which are not restricted to a single buried conducting line.

Preferentially, the substrate is of a semi-conductor material, such as Si or SiC, SiGe or a $Hg_{1-x}Cd_xTe$ based material, or a semi-conductor on insulator substrate (for example silicon on insulator, SOI). For diodes formed in $Hg_{1-x}Cd_xTe$, preferably a CdZnTe substrate will be used on which a $Hg_{1-x}Cd_xTe$ superficial layer is present.

In this case with a substrate in a semi-conductor material with one or more chemical elements, an advantageous alternative is that the buried conducting line consists of the same chemical element(s) as the material of the substrate and is doped with a doping element, called a line dopant.

The line dopant can be present with a density typically between $10^{15}$ and $10^{20}$ at/cm$^3$. This has several advantages. A first advantage is that it does not require an etching step and is simple to implement. A second advantage is that it is able to vary the conductivity of the buried conducting lines as a function of the doping density used. A third advantage is that a potential barrier is formed at the buried conducting lines, that is at the aforesaid surface, operating as a further mode of action in order to reduce the charge effects and stabilize said interface. Finally, a fourth advantage is achieved by allowing a choice on the type of majority carriers which are desired in the buried conducting lines, by doping with a line dopant either of the p type or of the n type.

In a particular situation, the buried conducting line is of a degenerate semi-conductor material. That is that the buried conducting line has a dopant density such that the semi-conductor material has a conductivity and a carrier mobility of a same order of magnitude as a metal. Consequently, the material is no longer a semi-conductor one and has no longer a band gap but a so-called effective band gap, as has been seen above. This is advantageous because the buried conducting lines, connected to the peripheral substrate contact, then do not contribute much or event not at all to the parasitic resistance. Then, the parasitic resistance only depends on a buried inter-contact distance between each diode and the buried conducting line located as close as possible to the said diode.

If the substrate has at least one superficial layer of a $Hg_{1-x}Cd_xTe$ based material having mainly a first cadmium composition, the buried conducting line has advantageously a second cadmium composition higher than the first composition.

It is preferably formed in a self-positioned way.

By increasing the cadmium composition in a $Hg_{1-x}Cd_xTe$ material, the band gap thereof is increased.

Zones having a second cadmium composition can be obtained by autodiffusing cadmium into the buried conducting line, initially at the first cadmium composition having a p+ type doping. Then, a self-positioned heterostructure can be formed in any point including a p+ type doping, in particular in buried conducting lines.

If the substrate is of $Hg_{1-x}Cd_xTe$ based material, and if the buried conducting lines are of "p" type or "p+" type doping, the line dopant is advantageously arsenic. Arsenic, in $Hg_{1-x}Cd_xTe$ materials, is a very good p type dopant. Conversely, if the buried conducting lines is of "n" type or "n+" type doping, the line dopant is advantageously boron. Boron in $Hg_{1-x}Cd_xTe$ materials is a very good n type dopant usable by ion implantation.

It is understood that in the previously described proposition, it is possible to form arrays where both doped zones of the diodes and buried conducting lines form and a self-positioned heterostructure at the second cadmium composition. Advantageously, the doped zones of the diodes and the buried conducting lines have dopings of the opposite type. Only one from the buried conducting lines and the doped zones can have a p+ type doping enabling self-positioned heterostructures to be formed. Then, preferably, only the buried conducting lines have the second cadmium composition.

Advantageously, the buried conducting lines are flush with the main surface of the substrate on a side where the diodes are present. Said surface can be an interface between the substrate and a dielectric layer covering the diodes and the substrate as pre-set out above. In this way, by being close to said surface or interface, the buried conducting lines have more readily an influence in reducing and/or diffusing the charge effects and stabilizing said surface or interface.

Alternatively, the buried conducting line is buried in the substrate, separated from the main surface by a given thickness of material of the substrate. The buried conducting lines are then of course on the side of the surface or interface of the substrate where the diodes are present. This alternative is advantageous in that it enables the buried conducting lines to be moved away from the diode contacts present at said surface or interface. The buried conducting lines are further protected from attacks or disturbances that can arise at said surface or interface.

A device according to the invention advantageously includes a buried conducting line between two neighbouring columns or diodes and/or neighbouring rows or diodes at least every k columns and/or m rows of the array, k and m can be for example thirty, two or one. It is thus possible to form an array wherein all the diodes are at a buried inter-contact distance from a buried conducting line lower than the inter-contact critical distance.

Advantageously, each buried conducting line, present between two neighbouring rows of a given length or between two neighbouring columns of a given length, has a length equal to or higher than the length of said columns or said rows. This makes it possible that the buried conducting lines connect two contact branches of the peripheral substrate contact located on opposite sides of the array. Since a buried conducting line has two ends, some buried conducting lines can be electrically connected to the peripheral substrate contact through their both ends. Conversely, it can be advantageous that some buried conducting lines have a length lower than that of the rows and/or columns. Such buried conducting lines can then only be in direct electrical contact with a single contact branch. Some of them can be in indirect electrical contact with the peripheral substrate contact by being connected to the peripheral substrate contact only through other buried conducting lines or by closer substrate contacts. This is of interest if a dense meshing of buried conducting lines is desired in a first location of the array and a looser meshing is desired in another location of the array.

The buried conducting lines have, being defined in a plane containing the diodes, a length and a width, the width being perpendicular to the length. In 15 μm pixel pitch "technology", the width is preferably between about 0.5 μm and 5 μm.

The buried conducting lines have a thickness, substantially defined along a normal to a plane containing the diodes. In "15 μm pixel pitch" technology, the thickness is preferably between about 0.5 μm and 2 μm.

The buried conducting lines can in some cases be electrically connected to one or more closer substrate contacts present in the array. The closer substrate contacts are then electrically contacting at least one buried conducting line. They are preferably electrically connected to the peripheral substrate contact by electrical connections other than the buried conducting lines. Thus, arrays having a very high area including a high number of diodes can be formed, even with buried conducting lines which are not of a degenerate semiconductor material or the height or/and width of which are too low. Such buried conducting lines could indeed, if they have a great length, have a significant impact on the parasitic resistance.

By creating closer substrate contacts, it is possible to reduce in the buried conducting lines the length contributing to the parasitic resistance for a given diode. The advantage of the invention towards the state of the art in this point is that by virtue of the use of buried conducting lines, much fewer closer substrate contacts are required. According to the invention, there is thus a reduction in the number and frequency of periodicity disturbances induced by the use of closer substrate contacts with respect to the state of the art.

If the buried conducting lines form a meshing and if one or more closer substrate contacts are present in the array, the closer substrate contacts can be inserted between two neighbouring rows and/or two neighbouring columns or can be in replacement of a diode.

BRIEF DESCRIPTION OF THE DRAWINGS

The invention will be better understood, and further details, advantages and characteristics thereof will appear upon reading the following description given by way of non-limiting example and in reference to the appended drawings wherein.

Identical, similar or equivalent parts in different figures bear the same reference numerals so as to facilitate switching from one figure to another.

The different parts represented in the figures are not necessarily drawn to a uniform scale, to make the figures more legible.

The figures illustrative of different embodiments of the device according to the invention are given by way of example and are not limiting in any way.

DETAILED DISCLOSURE OF PARTICULAR EMBODIMENTS

Figure 5A:
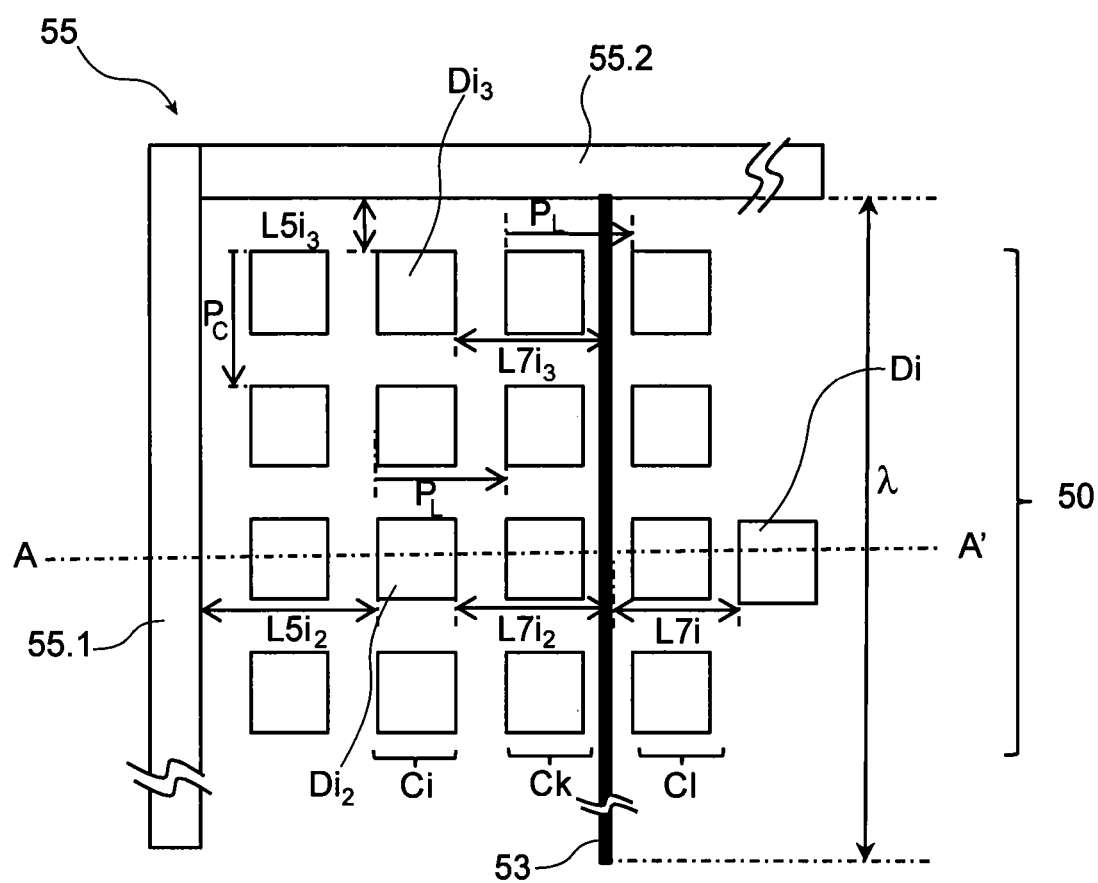
Figure 5B:
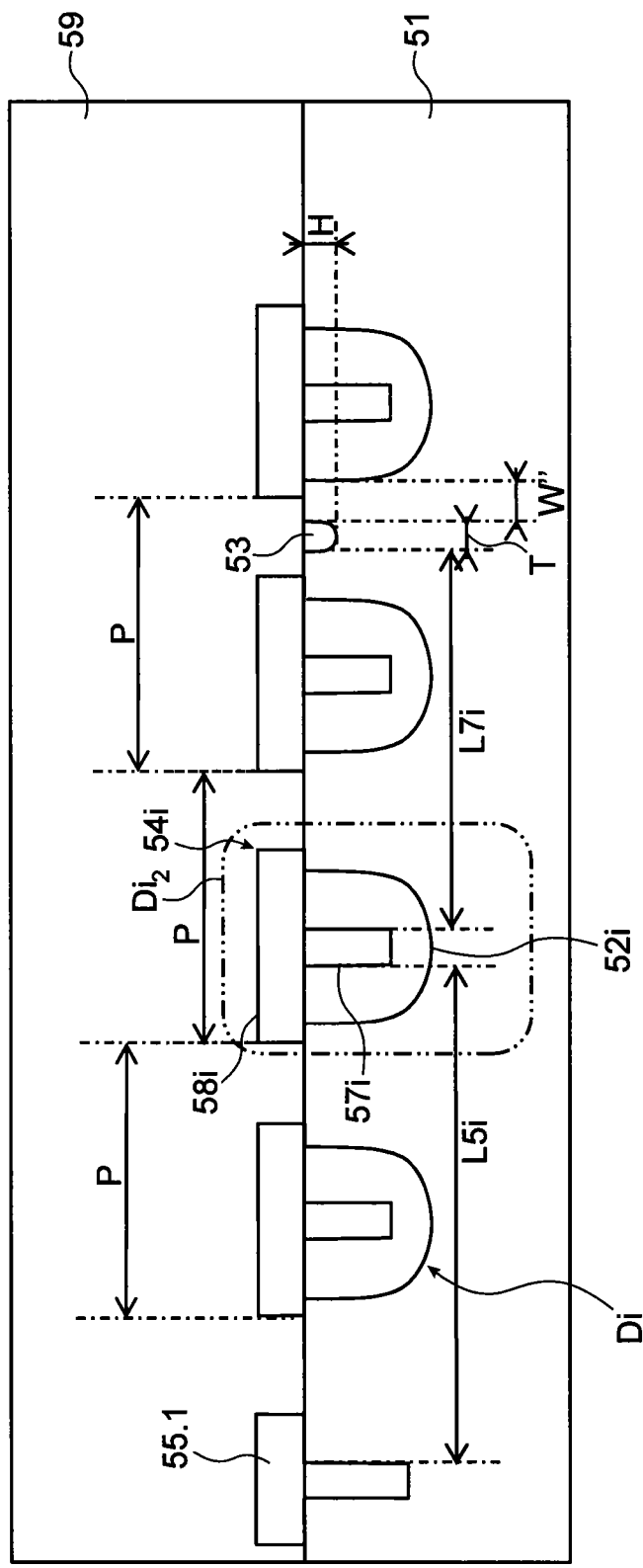

In first place, the invention relates to an array of diodes such as described in FIGS. 5A and 5B.

FIG. 5A illustrates a top view of an array of diodes Di. These are provided on a substrate represented in a non-limited way and are arranged in rows (Li) and columns (Ci, Ck, Cl).

In FIG. 5A are represented, for simplifying purposes, seventeen diodes Di, distributed into four rows and four columns plus a diode. However, the invention is still valid for any arrangement and any number of diodes on several rows and several columns. Each diode includes in surface a diode contact allowing electrical contacting between the diode Di and an electrical or electronic circuit not shown. Since FIG. 5A is a top view of the array 50 of diodes, only the diode contacts are represented, because these are the only parts projecting for a main surface of the substrate. To facilitate the understanding of the figure, in the continuation of the description, for the top views, the diode contacts represented will be assimilated to their respective diodes Di.

The diodes Di are periodically arranged in the array 50 with a majority row pitch $P_L$ in a same row and a majority column pitch $P_C$ in a same column. In the continuation, it will be considered for simplifying purposes that the majority column pitch $P_C$ and the majority row pitch $P_L$ are substantially equal; their value will be called "pixel pitch P". However, in the case where the majority row pitch and the majority column pitch are different, the invention remains applicable, since those skilled in the art are able to apply the teachings of the invention to an array 50 where the majority column pitch $P_C$ and the majority row pitch $P_L$ are different. Moreover, as set out previously, the diodes can be arranged in first diagonals, in second diagonals and in rows and not only in rows and columns. Those skilled in the art will be readily able to apply the teachings of the invention to such an array.

The array 50 includes in periphery a peripheral substrate contact 55. This consists, in the example of this figure, of two contact branches 55.1, 55.2 which border the array 50 on two successive sides. Alternatively, the peripheral substrate contact 55 could include a single contact branch, three or four contact branches or more and thus border the array 50 on the same number of sides, whether successive, opposite or else.

It is considered that in the array 50, at least one diode Di is located at an inter-contact border distance from any branch of the peripheral substrate contact 55.1, 55.2 higher than an inter-contact critical distance. The inter-contact critical distance is such as defined above. This means that at least one of the diodes Di is too far from any contact branch 55.1, 55.2 for the diode to have an acceptable performance upon use. This is for example a diode Di located in a central part of the array.

In order not to suffer from defects caused by use of closer substrate contacts, the invention attempts to minimize the number of closer substrate contacts according to the state of the art and possibly not to use closer substrate contacts.

In place of the closer substrate contacts, the invention suggests to inserting, in the substrate 51, between at least one first column Ck and a second column Cl, neighbouring each other, and/or between two neighbouring rows of diodes of the array, a buried conducting line 53. This has at least one end which is electrically connected to the peripheral substrate contact 55. In the example of FIG. 5A, it is connected through one of its end to the contact branch 55.2. It is further without direct electrical contact with any diode Di of the array 50, neither at the diode contacts 51, nor at the doped zones mentioned above.

The buried conducting line 53 is provided in the substrate 51. It can be flush with the main surface of the substrate 51. Said main surface can be an interface between the substrate 51 and an upper layer, for example of dielectric material. The diode contacts mentioned above are positioned at said main surface or interface.

Alternatively, the buried conducting line 53 can be buried into the substrate 51, that is it may not be located at the main surface or main interface previously described. The buried conducting line 53 is then separated from the main surface or interface by a given thickness of material of the substrate. In both aforesaid cases, the surface can be an interface between the substrate 51 and a dielectric layer which will be illustrated later in connection with FIG. 5B. Being connected to the peripheral substrate contact 55, the buried conducting line 53 can act as an extension of the peripheral substrate contact 55.

If the buried conducting line 53 is positioned between two neighbouring columns, respectively two neighbouring rows, it has a length 2 measured along a main direction of the column, respectively of a row.

Each diode Di of the array is said at an inter-contact buried distance L7$i$ from the buried conducting line 53. In particular, in FIG. 5A, any two diodes Di$_2$, Di$_3$ are referenced. They are respectively at an inter-contact border distance L5$i_2$, L5$i_3$ from the substrate contact 55 and at an inter-contact buried distance L7$i_2$, L7$i_3$ from the buried conducting line 53.

Figure 1A:
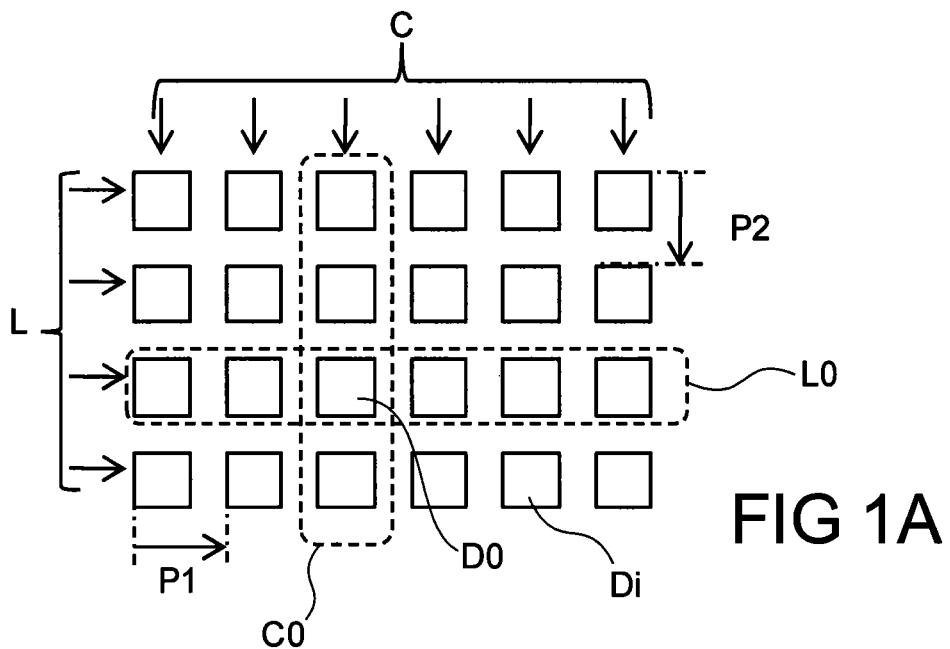
FIGS. 1A and 1B illustrate two ways of arranging diodes in a array, either in rows and in columns, or with a three order axial symmetry.
Figure 1B:
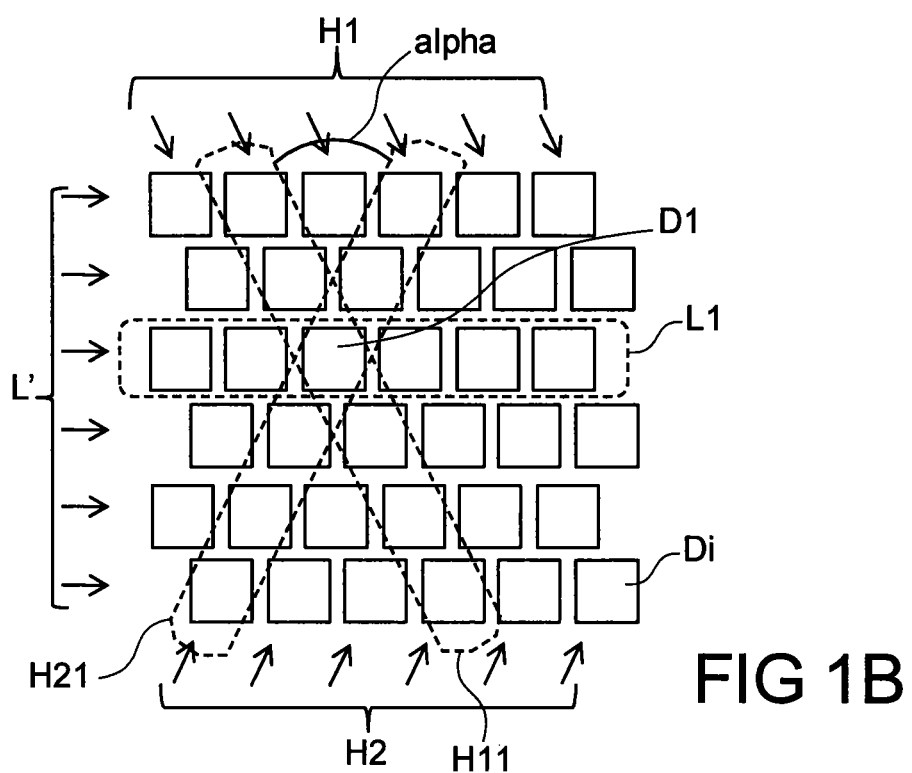
Figure 2:
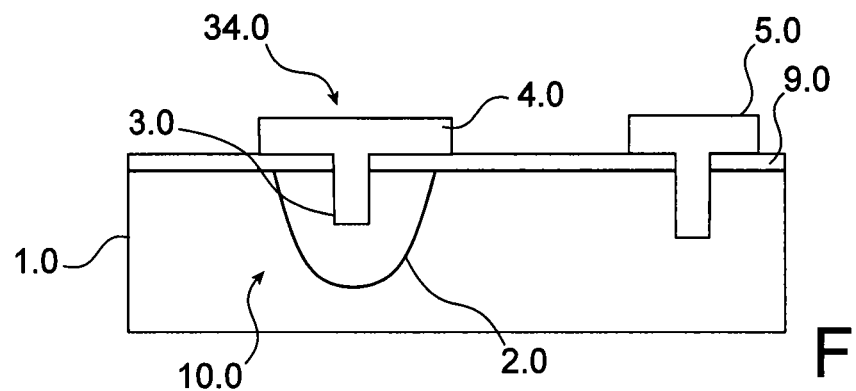
FIG. 2 is a structure diagram of a diode.
Figure 3A:
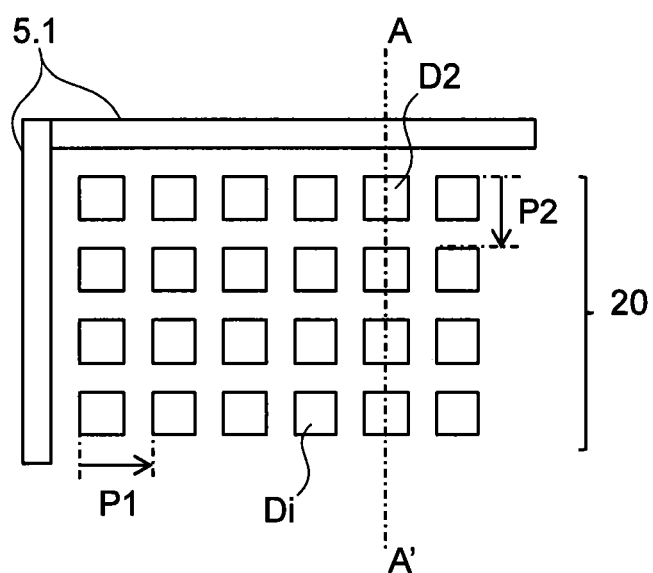
FIGS. 3A to 3C are illustrative of a generic problem according to the state of the art related to the formation of a parasitic resistance related to each diode, FIGS. 3A and 3C being top views of an array of diodes and FIG. 3B representing a cross-section view of an array of diodes, FIGS. 4A and 4B respectively illustrate a cross-section and top views of an array of diodes according to the state of the art including a closer substrate contact, FIGS. 5A and 5B respectively illustrate a top and cross-section views of an array of diodes according to the invention including between two neighbouring columns of diodes, a buried conducting line.
Figure 3B:
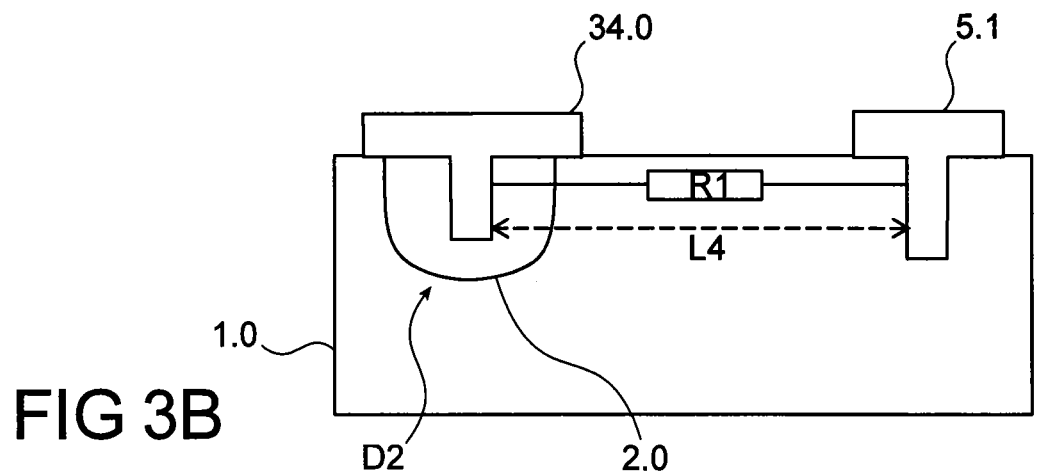
Figure 3C:
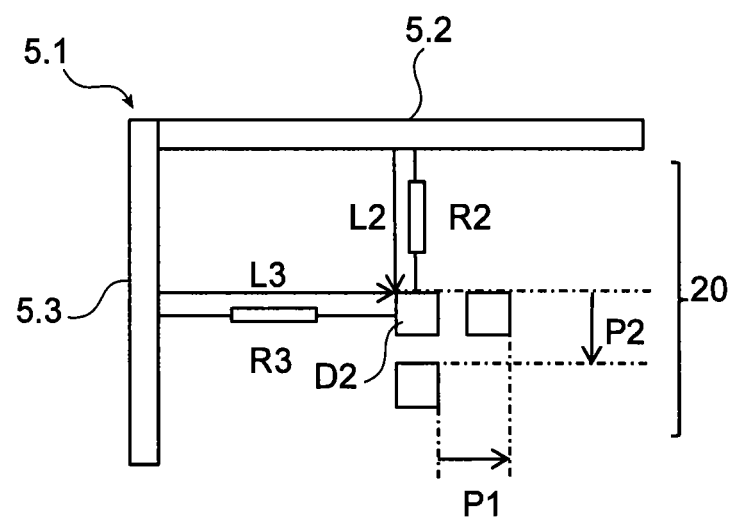
Figure 4A:
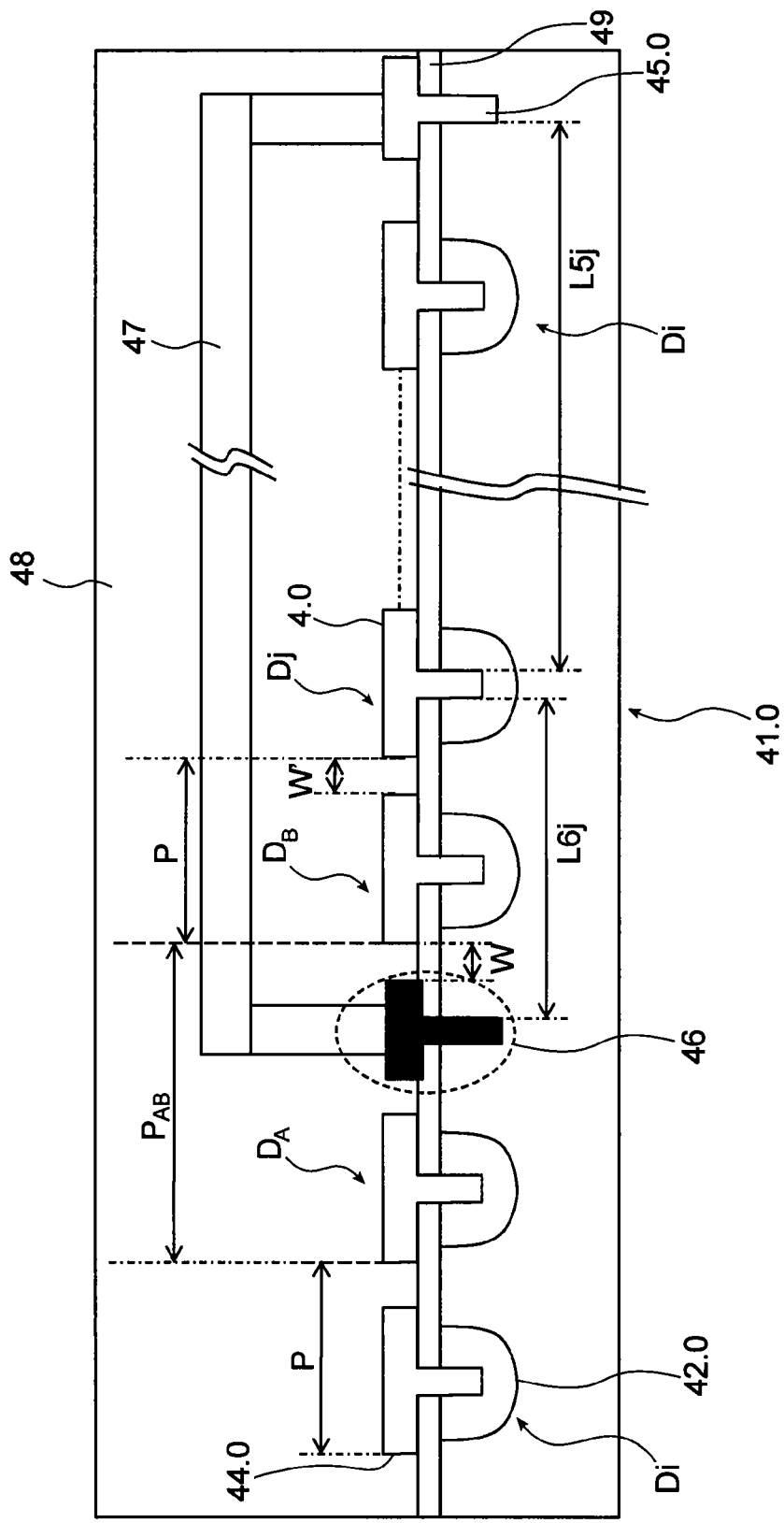
Figure 4B:
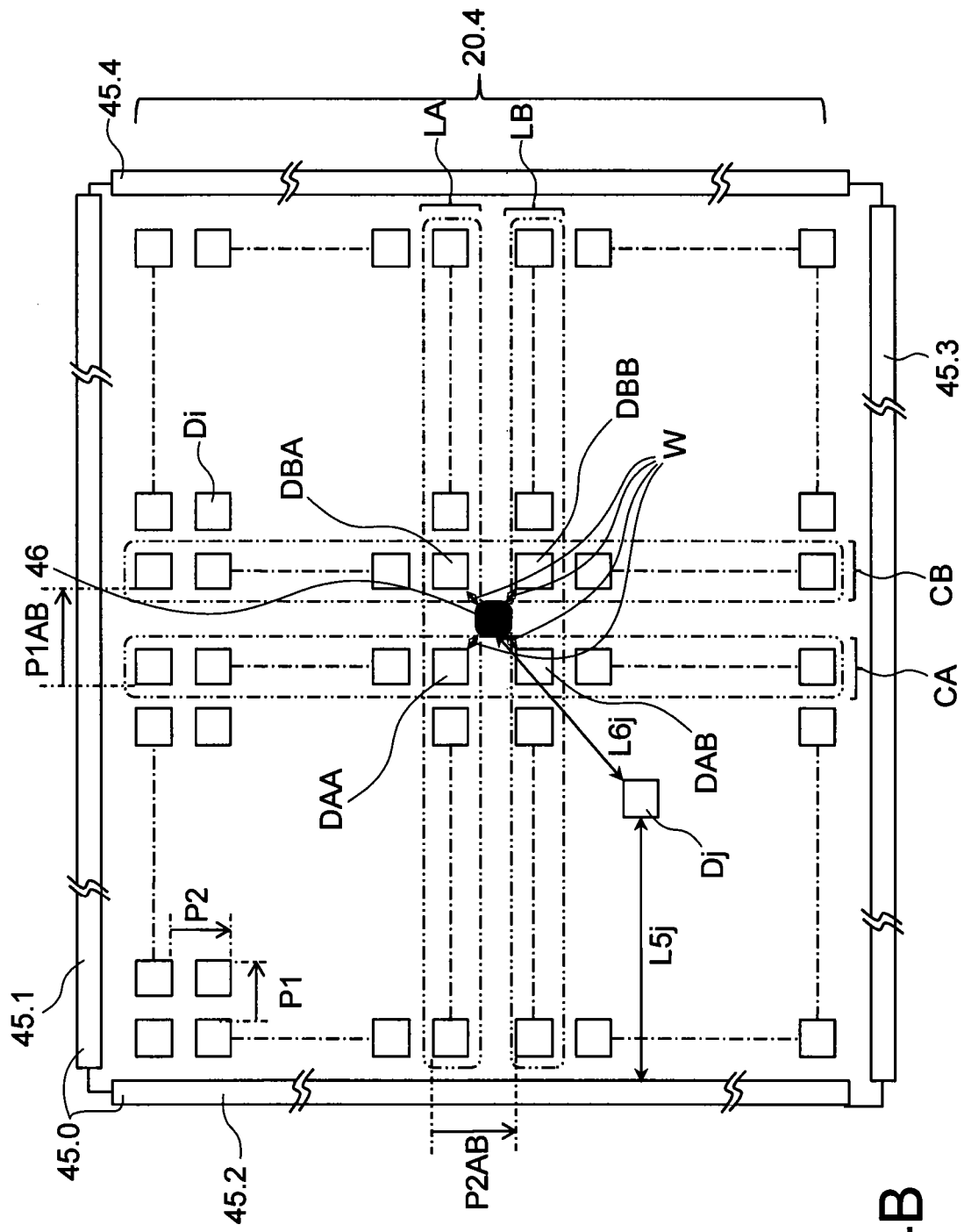

FIG. 5B is a cross-section view of FIG. 5A along an axis AA', intersecting several diodes Di of the array 50 belonging to a same row. Each diode Di includes at least one second doped zone 52$i$ in the substrate 51 as described above in connection with FIG. 2. For simplifying purposes, the second doped zone will be called "doped zone 52$i$" in the continuation of the description.

The substrate is of a semi-conductor material. The substrate 51 can be of Si, SiGe, Hg$_{1-x}$Cd$_x$Te, GaAs, InP, SiC or semi-conductor on insulator (SOI) or any other semi-conductor material known to those skilled in the art to allow for diodes and in particular diodes having optical properties to be manufactured. Each diode Di further includes a diode contact 54$i$ consisting of a foot 57$i$ located inside the doped zone 52$i$ and a head 58$i$ located in surface of the substrate 51. The head 58$i$ is generally covered with a dielectric layer 59, so as to support electrical connections and interconnections not shown connecting the diodes Di to an external electronic circuit not shown.

In FIG. 5B is illustrated a cross-section view of the contact branch 55.1 of the peripheral substrate contact 55, at least one part of which penetrates the substrate 51. Are further represented cross-section views of four diodes, among which the diode reference Di$_2$, and a cross-section view of the buried conducting line 53. The buried conducting line 53 has a thickness H measured along an axis substantially perpendicular to a plane defined by the diodes Di. The buried conducting line 53 further has a width T measured substantially perpendicularly to the thickness H and the length X.

Each diode contact 54$i$ is such that there is an inter-contact border distance L5$i$ between the foot 57$i$ of the diode contact 54$i$ and the peripheral substrate contact 55, here the contact branch 55.1. Furthermore, the foot 57$i$ of each diode contact 54$i$ is at an inter-contact buried distance L7$i$ from the buried conducting line 53.

According to the invention, the buried conducting line 53 is separated at least by a minimum distance W" from any doped zone 52$i$ of the diodes Di. Too low a minimum distance W" could result in forming leakage currents between the doped zone 52$i$ and the buried conducting line 53. Values of W" are given later by way of example.

The width T and the thickness H are preferably such that the buried conducting line 53 does not disturb the arrangement periodicity of the diodes Di. It is then possible to sandwich the buried conducting line 53 between two rows or two columns of the array, in a space usually present between two neighbouring diodes, without modifying the pixel pitch P of the array. The width T and the height H of the buried conducting line 53 are further suitable for the buried conducting line to fill a volume as high as possible in the space usually present between two neighbouring diodes without forming leakage currents with the diodes. The more the buried conducting lines have a high cross-section area, the lower their resistance. Moreover, as will be set out herein below, the more the buried conducting line 53 has a high cross-section area, the more it stabilizes the interface between the substrate 51 and the dielectric layer 59.

The width T and the thickness H of the buried conducting line 53 depend on the technology used for manufacturing the array of diodes Di. Values of dimensions will be given by way of example within the scope of the so-called "15 μm pixel pitch" technology, wherein the pixel pitch or majority pitch of the array is close to 15 μm for rows and columns as well.

The width T of the buried conducting line 53 can be between 0.5 μm and 5 μm, for example 1 μm or 2 μm.

The thickness H of the buried conducting line 53 is approximately in the same order of magnitude as its width T, for example between 0.5 μm and 2 μm.

Furthermore, in a "15 μm pixel pitch" technology, the diodes Di can have a head 58$i$ of diode contact the area of which is 10×10 μm$^2$, the doped zone 52$i$ can have an area, in a plane parallel to the main surface of the substrate, close to 12×12 μm$^2$.

If the diodes have different dimensions, either because of the use of another microelectronic technology, or because of a different application for the diodes, the dimensions of the buried conducting line 53 are then suitable.

In a preferential alternative, the buried conducting line 53 is another doped zone in the substrate. It consists of the same chemical element(s) of the semi-conductor material of the substrate 51, but this material is doped differently. The buried conducting line 53 is then mainly differentiated from the substrate 51 in that it includes a line dopant having a high doping density, higher by several orders of magnitude than the doping present in the material of the substrate 51. The buried conducting line 53 is then defined as being in a volume containing the line dopant, this volume being connected to the peripheral substrate contact 51.

The density of the line dopant in the semi-conductor material forming the buried conducting line is typically between $10^{15}$ and $10^{20}$ at/cm$^3$. By way of comparison, the substrate 51, except for the doped zones 52$i$ of the diodes Di, has a density typically between $10^{14}$ and $10^{17}$ at/cm$^3$.

If the line dopant is of the acceptor type, a p+ type doping is obtained. If the line dopant is of the donor type, an n+ type doping is obtained.

In some situations, the line dopant can be present with such a density, for example higher than $10^{18}$ at/cm$^3$, that the material of the buried conducting line 53 becomes degenerate. This means that the material of the substrate 51, initially semi-conductor, acquires, in the volume defining the buried conducting line 53, a metal behaviour because of the presence of the dopant. In practice, the material of the buried conducting line 53 then has a conductivity and mobility having a same order of magnitude as those of metals usually used in microelectronics.

In some situations, the dopant density in the buried conducting line 53 is insufficient to have a degenerate semi-conductor material in the buried conducting line 53.

In the continuation of the description, a half-length of the buried conducting line will be defined as being a distance between the diode as far as possible from any part of the peripheral substrate contact (or closer substrate contact) and said substrate contact, measured by following an axis whereon a buried conducting line 53 can be located. If there are two contact branches positioned on opposite sides of the array, the half-length will be substantially equal to half the distance separating both these contact branches. If additionally some buried conducting lines 53 connect both these opposite contact branches, the half-length is substantially equal to half the length A, of said buried conducting line 53. Alternatively, if all the contact branches do not have a contact branch located on an opposite side of the array, some buried conducting lines 53 are only connected to the contact branches through a single end. The half-length is then substantially equal to the length X of these buried conducting lines 53.

In the continuation of the description, three conductivity categories will be defined for the buried conducting lines.

It will be said that the buried conducting line 53 has a sufficient conductivity of first category, called first conductivity, if it has a resistance, measured for a half-length of the buried conducting line 53, which is negligible relative to the critical resistance, for example lower by a factor higher than 2 or 5 or 10.

The buried conducting lines consisting of a degenerate semi-conductor material are often considered as having a first conductivity according to the meaning of the invention. This can be not true if the cross-section of said buried conducting lines is too low.

It will be said that the buried conducting line 53 has an acceptable conductivity of second category, called second conductivity, if its resistance, measured under the above defined conditions, is lower than the critical resistance. A buried conducting line 53 having a first conductivity has a fortiori a conductivity higher than the second conductivity.

Otherwise, it will be said that the buried conducting line has an insufficient conductivity according to the meaning of the invention. In some situations, a buried conducting line 53 consisting of a non-degenerate doped semi-conductor material can have a second conductivity or an insufficient conductivity according to the meaning of the invention. The latter case will be discussed later in the description.

Advantageously, the material of the buried conducting line 53 is differentiated from the doped zone 52$i$ in that the line dopant and that of the doped zone 52$i$ are of different types. Thus, depending on whether the doped zone 52$i$ includes a p type dopant or an n type dopant, advantageously, the buried conducting line 53 will include a line dopant inducing an n type doping or a p type doping respectively.

In particular, if the material of the substrate is of HgCdTe or $Hg_{1-x}Cd_xTe$ type, in the case of p/n diodes, including a doped zone 52$i$ including a p type dopant, the line dopant present in the buried conducting line 53 can be of the n type such as indium or boron. Conversely, by keeping the same material for the substrate, in the case of n/p diodes, including a doped zone 52$i$ including an n type dopant, the line dopant can be of the p type such as arsenic.

If the buried conducting line 53 has a first conductivity according to the meaning of the invention, and that it is formed of a degenerate semi-conductor material, it is considered that it is comparable to a branch of a peripheral substrate contact 55 but located between two neighbouring rows and/or two neighbouring columns of the array 50. Indeed, it is considered that the buried conducting line 53 has no influence on the parasitic resistance perceived by the diodes Di. In other words, the resistance of the buried conducting line 53 is considered negligible. Then, if, for a diode Di, the inter-contact inner distance L7$i$ is lower than the inter-contact critical distance, the parasitic resistance perceived by said diode Di is lower than the critical resistance. A gain cannot be assessed by the dimensions of the array of diodes which gain is made possible by the use of such buried conducting lines 53 with respect to the state of the art. Indeed, for buried conducting lines having a first conductivity according to the meaning of the invention, an array of diodes can have any desired size.

There is however a parasitic resistance associated with each diode Di, related at the first order to a smaller distance from the inter-contact border distance L5$i$ and the inter-contact buried distance L7$i$.

If the buried conducting line 53 does not have a sufficiently high conductivity, it cannot be considered that the buried conducting line 53 is comparable to a branch of the substrate contact 55. Then, to know if the diode Di perceives a parasitic resistance lower than the critical resistance, the parasitic resistance due to the substrate and that due to the buried conducting line should be taken into account. The parasitic resistance due to the substrate is measured as a function of the smallest distance between the inter-contact border distance L5$i$ and the inter-contact buried distance L7$i$.

The resistance of the buried conducting line 53 is measured on an effective length of the buried conducting line 53, that is between the peripheral substrate contact 55 and a point of the buried conducting line 53 located as close as possible to the diode Di.

However, whether the buried conducting line 53 has a first conductivity, a second conductivity or an insufficient conductivity according to the meaning of the invention, its conductivity remains much higher than a characteristic conductivity of the substrate material.

The border parasitic resistance R1 between a diode contact of a given diode and the peripheral substrate contact 55 is given by the following relationship {1}:

$$R1 \approx \frac{L5}{\mu \times \Delta \times E \times l}$$

With $\mu$ an initial carrier mobility in the substrate, L5 the inter-contact border distance related to the given diode, $\Delta$ a doping density in the substrate, E a substrate thickness and l a characteristic length to the diode contact and comparable at the first order to a pixel pitch. For a diode to operate acceptably, it is necessary according to the state of the art that the parasitic resistance needs to be lower than the critical resistance. The critical resistance is measured when a current flows in the substrate on the inter-contact critical distance defined above.

Then, in the same way, it is possible to calculate a value of the parasitic resistance $R_{line}$ induced by the buried conducting line 53. According to the relationship {2} below, the parasitic resistance $R_{line}$ due to the line depends on the effective length $L_{effective}$ defined above.

$$R_{effective} \approx \frac{L_{effective}}{\mu \times \Delta_{line} \times H \times T}$$

The parasitic resistance $R_{line}$ further depends on the width T and the thickness H of the buried conducting line 53 as well as the doping density $\Delta_{line}$ in the buried conducting line 53.

To the parasitic resistance related the buried conducting line 53, it is necessary to add, to the parasitic resistance, a secondary parasitic resistance component.

This is related to a portion of substrate 51 separating the studied diode from the buried conducting line 53. This secondary parasitic resistance is calculated in a similar way as the relationship {1}, the inter-contact border distance L5$i$ being replaced by the inter-contact inner distance L7$i$.

If the buried conducting line is in close proximity to the studied diode, that is positioned between the studied diode and a neighbouring diode, the secondary parasitic resistance is negligible. Having a higher conductivity than the material of the substrate 51, the buried conducting line 53 has a parasitic resistance $R_{line}$ lower than the border parasitic resistance R1 expressed by the relationship {1}. Both these resistances, R1, $R_{line}$ being in parallel to each other, it follows that the studied diode Di is connected to the peripheral substrate contact 55 by a favoured conduction channel via the buried conducting line 53.

Thus, the buried conducting line 53 enables the parasitic resistance between the studied diode and the substrate contact to be reduced and thus virtually reduces the inter-contact border distance.

It is thus possible to calculate a resistance gain being obtained through the use of a buried conducting line 53 located in close proximity to the diode Di.

The relationship {3} below enables the gain G to be expressed as a function of the previously described parameters. It will be considered that since the buried conducting line 53 is located in close proximity to a diode, the inter-contact border distance L5 and the effective length $L_{effective}$ of the buried conducting line are substantially identical.

$$G = \frac{R_{line}}{R} = \frac{\Delta}{\Delta_{lige}} * \frac{E}{H} * \frac{l}{T} * \frac{\mu}{\mu_{line}} * \frac{L_{effective}}{L}$$

For the purposes of the calculation, particular examples of dimensions for the diode contact 54*i* and the buried conducting line 53 will be considered. These particular examples are dependent on the technology used for manufacturing diodes, herein the "15 µm pixel pitch" technology, and on the application aimed at for the diodes.

It is considered, for the purposes of the calculation, that the buried conducting line has a width T in the order of 3 µm and a thickness H of about 2 The pixel pitch considered is 15 µm and the thickness E of the substrate is approximately 10 µm. Furthermore, the mobility in the substrate could be measured as substantially equal to 400 cm$^2$/V.s whereas the mobility in the buried conducting line has a value close to 200 cm$^2$/V.s. The dopant density in the substrate is close to $1.10^{16}$ at/cm$^3$. In comparison, in the example studied, the dopant density in the buried conducting line can be in the order of $1.10^{18}$ at/cm$^3$.

The gain G, calculated by means of the relationship {3}, then has a value between 2 and 100. The presence of the buried conducting line 53 in close proximity to a diode Di induces a virtual reduction in the inter-contact border distance by a factor between 2 and 100. Each diode, located at a given distance from the peripheral substrate contact 55, indeed perceives a parasitic resistance 2 to 100 times lower when it is located in close proximity to a buried conducting line than that it perceives, according to the relationship {1}, when a current flows in the substrate on the same distance and when there is no buried conducting line.

If the buried conducting line has a second conductivity according to the meaning of the invention, the resistance of the buried conducting line measured on the half-length is lower than the critical resistance. Then, by positioning at least one buried conducting line 53 in close proximity to any diode Di, it is possible to design an array not including closer substrate contacts and having dimensions 2 to 100 times higher than those of the state of the art. Advantageously, for this method, the buried conducting line is electrically connected to the peripheral substrate contact at both its ends.

If it is desired to obtain a still greater array, increasing the doping density in the buried conducting lines 53 may be contemplated so as to increase the gain G and thus have a higher virtual reduction in the inter-contact distance. Alternatively, the use of buried conducting lines 53 of degenerate semi-conductor material may be contemplated. They have then a first conductivity according to the meaning of the invention and are comparable to branches of the peripheral substrate contact, which are located within the array. Finally, it is possible to introduce closer substrate contacts in the array 50 as will be described later. This is particularly useful if the buried conducting lines have an insufficient conductivity according to the meaning of the invention or if they have a second conductivity according to the meaning of the invention but there are diodes which are not located in close proximity to the buried conducting lines. However, by using buried conducting lines 53 according to the invention, each diode can be located at an inter-contact inner distance from said closer substrate contact which is higher than that of the state of the art.

The state of the art enables an array of diodes to be manufactured such that each diode be spaced from a peripheral substrate contact or a closer substrate contact by a distance lower than the inter-contact critical distance.

According to the invention, by inducing a virtual reduction in the inter-contact distances by a factor 2 to 100, the buried conducting lines enable an array having the same dimensions as in the state of the art to be obtained while introducing 2 to 2500 times fewer closer substrate contacts than according to the state of the art. In some cases, if by introducing 2 to 2500 times fewer closer contacts than according to the state of the art, a theoretical number of closer contacts lower than 1 is obtained, the closer substrate contacts can be completely removed in the array. Such a situation is already described above in connection when the buried conducting lines have a second conductivity according to the invention.

By following the teaching of the invention, it is possible to place a buried conducting line 53 between two neighbouring rows and/or between two neighbouring columns. It is further possible to provide several buried conducting lines 53, each between two neighbouring rows and/or two neighbouring columns. If there are both a buried conducting line between two neighbouring rows and a buried conducting line between two neighbouring columns, both buried conducting lines cross at an intersection and form a meshing of buried conducting lines.

In practice, according to the invention, there can be as many buried conducting lines, each present between two neighbouring rows or two neighbouring columns of the array, as is necessary for each diode of the array to be connected to a peripheral or closer substrate contact, via a parasitic resistance lower than the critical resistance, that is negligible for an acceptable operation of the diode.

If the buried conducting lines 53 have a first configuration according to the meaning of the invention, of degenerate semi-conductor material, they are provided in the array such that each diode Di is at a distance from at least one branch of the peripheral substrate contact 55 or at least one buried conducting line 53 lower than the inter-contact critical distance If the buried conducting lines 53 does not have a first conductivity according to the meaning of the invention, they are provided in the array 50 such that each diode Di is at a virtual distance from at least one branch of the peripheral substrate contact 55, from at least one closer substrate contact, lower than the inter-contact critical distance. This virtual distance takes the effect of virtual reduction in the inter-contact distances allowed by the buried conducting lines 53 set out below into account.

Preferably, if the array is formed by rows having a first length and columns having a second length, the buried conducting line(s) 53 located between two neighbouring rows have a length equal to or higher than the first length and the buried conducting line(s) 53 present between two neighbouring columns have a length equal to or higher than the second length. Indeed, if the substrate contact 55 includes four contact branches, arranged two by two along opposite sides of the array 50, it is preferable that the buried conducting line(s) 53 be electrically connected to both contact branches located on opposite sides of the array 50.

A device according to the invention can include a buried conducting line between two neighbouring columns of diodes and/or neighbouring rows of diodes every k columns and/or every m rows of the array, periodically. In the continuation of the description, a second, a third and a fourth embodiments will be described illustrating this. In these different embodiments, the k and m values are equal to each other and are respectively 30, 2 and 1. It is of course possible that k and m have different values. This is specially the case if the row pitch and the column pitch have different values. According to a second embodiment of the invention, described in FIG. 6, there is in a array 60, a buried line 63 between two neighbouring rows and/or between two neighbouring columns every 30 rows or 30 columns of the array.

The inter-contact critical distance, by taking a safety margin into account, can be assessed at a value close to fifteen times a value of the pixel pitch P within the scope of the 15 μm pixel pitch technology. Thus, according to the state of the art, a closer substrate contact has being positioned every 20 rows and 20 columns such that all the diodes are at an inter-contact inner distance lower than the inter-contact critical distance.

In this embodiment of the invention, each diode Di of the array 60 is at most at a distance of 15 μm pixel pitch from a buried conducting line 63. Thus, each diode is at an inter-contact buried distance from a buried conducting line 63 lower than the inter-contact critical distance.

Figure 6:
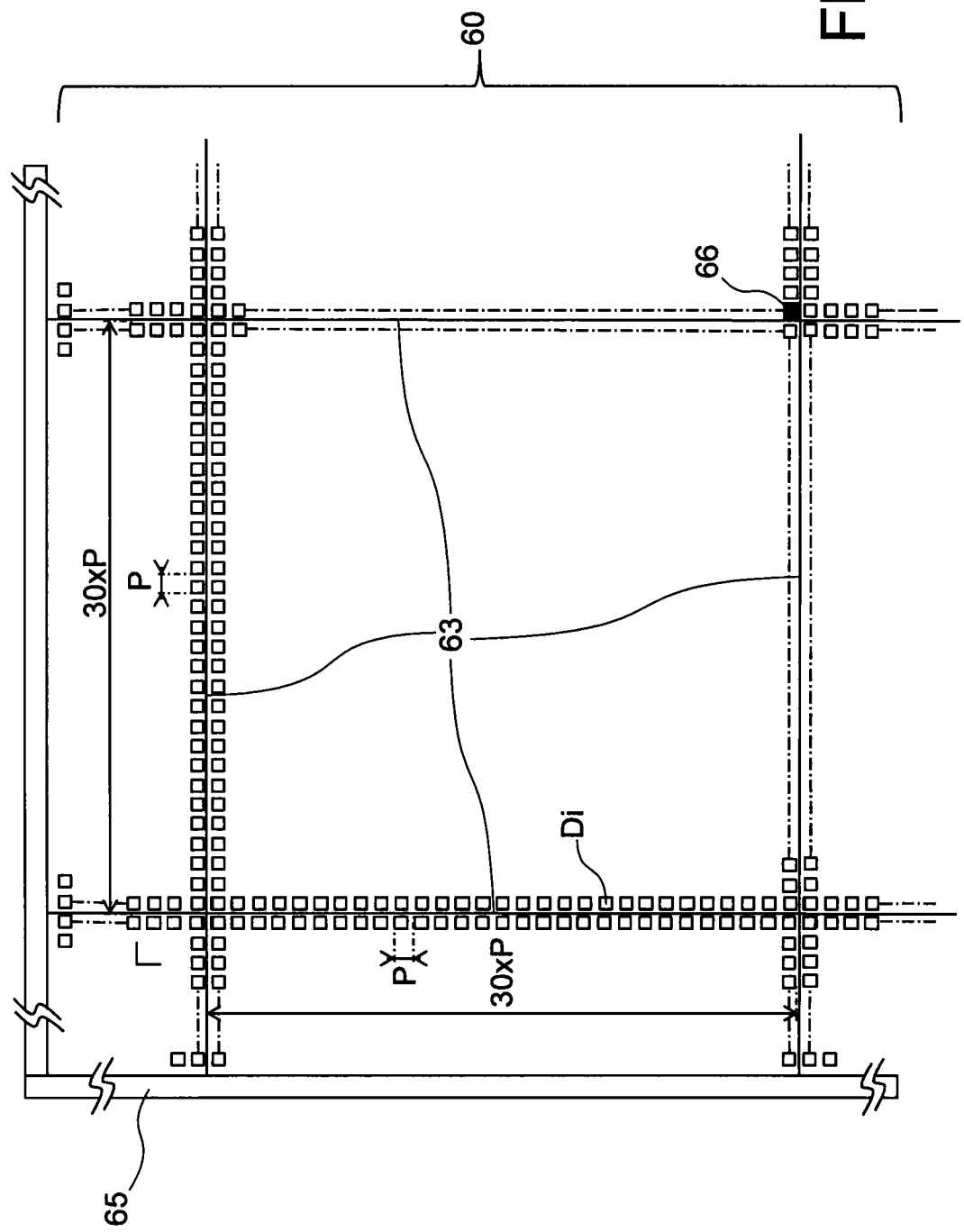
FIGS. 6, 7 and 8 illustrate three exemplary embodiments of the device according to the invention including several buried conducting lines arranged every k rows and m columns of diodes, k and m having a same value in these examples, and being respectively 30, 2 and 1.

This embodiment, illustrated in FIG. 6, is advantageous if the buried conducting lines 63 have a first conductivity according to the meaning of the invention, in particular if they are of a degenerate semi-conductor material. Indeed, any resistance induced by the buried conducting line 63 being then ignored, each diode Di perceives a parasitic resistance lower than the critical resistance. It is then possible for the closer substrate contacts to be dispensed with.

If the buried conducting lines 63 are not of a degenerate semi-conductor material, it is necessary to make sure that the conductivity of the buried conducting lines 63 is sufficient to have a negligible contribution to the parasitic resistance perceived by a diode as far as possible from any buried conducting line 63. The doping density has then to be adapted to vary the conductivity as a function of the length λ of the buried conducting line 63 and as a function of the dimensions of the array 60. Alternatively, the buried conducting lines can be moved closer such that the inter-contact buried distance is reduced by taking the parasitic resistance induced by the buried conducting lines into account. This thus enables buried conducting lines not having a first conductivity according to the invention but which contribute to the parasitic resistance to be used.

Alternatively, in the case where the buried conducting lines 63 have an insufficient conductivity according to the meaning of the invention or a second conductivity, one or more closer substrate contacts 66 can be added in the array. The closer substrate contacts 66 are located in the array so as to be in direct electrical contact with at least one buried conducting line 63 and preferably with two buried conducting lines 63 at a time. For example, the closer substrate contacts 66 can be at an intersection of two buried conducting lines 63.

In this FIG. 6, a closer substrate contact 66 is represented, integrated in the array in replacement of the diode Di at an intersection of two buried conducting lines 63 and in electrical contact with both these buried conducting lines 63. Alternatively and not shown, the closer substrate contact can be inserted between two neighbouring rows and/or two neighbouring columns, giving between these two neighbouring rows and/or neighbouring columns an extended pitch higher than the majority row or column pitch.

Figure 7:
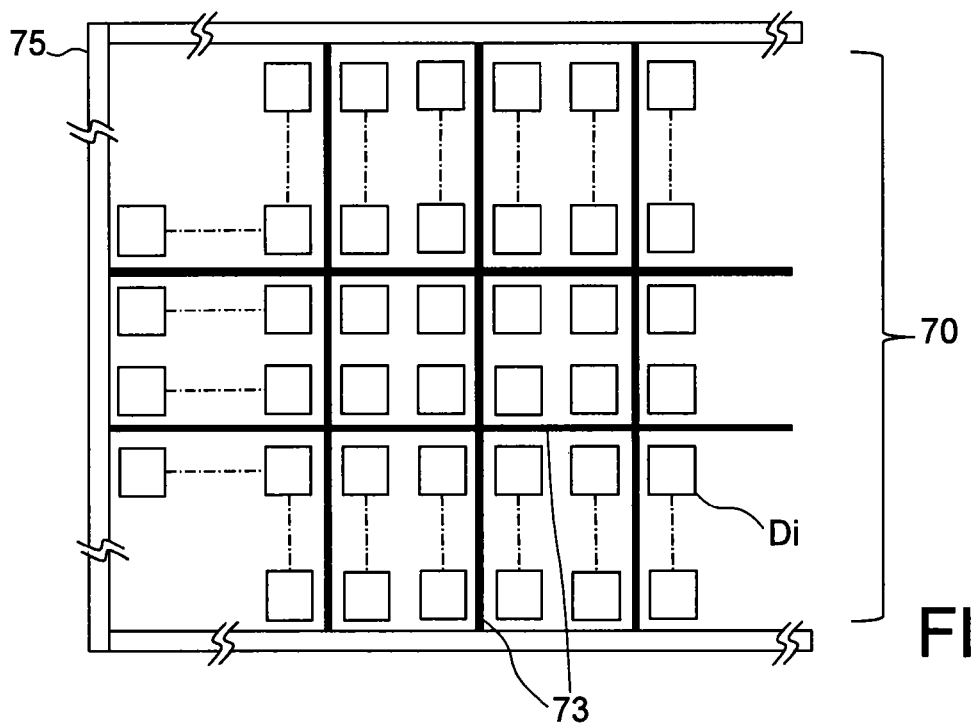

According to a third embodiment, illustrated in FIG. 7, there is in the array 70 a buried line 73 extending between two neighbouring rows and/or between two neighbouring columns every two rows and/or two columns of the array. Moreover, in this figure, three branches have been represented for the peripheral substrate contact 75. Two of the contact branches are located on opposite sides of the array 70. Some buried conducting lines 73 are simultaneously electrically connected to both these opposite contact branches.

A potential difference applied between the diode contacts of the different diodes Di and a peripheral substrate contact 75 present in the array border becomes comparable to a potential difference applied between the diode contacts and the neighbouring buried conducting lines 73. Since a buried conducting line 73 is provided between two rows or between two columns every two rows and every two columns of the array, then, the diodes Di are surrounded four by four by buried conducting lines 73. Each diode Di of the array perceives a substantially identical electrical field from the buried conducting lines 73, only varying by a rotation of 90°.

This situation further makes it possible to have a minimum parasitic resistance if it is considered that the buried conducting lines 73 do not have a contribution to the parasitic resistance, that is if they have a first conductivity according to the meaning of the invention, for example if they are of a degenerate semi-conductor material.

Figure 8:
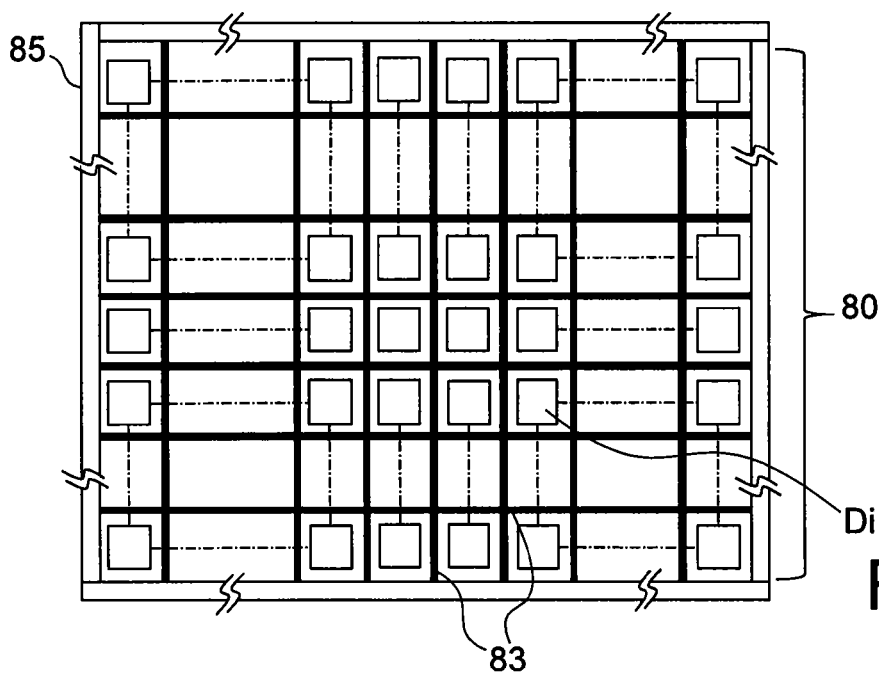

In a fourth embodiment, illustrated in FIG. 8, there is in an array of diodes 80 a buried conducting line 83 between each row and each column of the array. The k and m values are then respectively equal to one.

Further, in this figure four contact branches are represented for the peripheral substrate contact 85. The contact branches are located in the border of the array 80 and are arranged two by two so as to border four sides of the array, opposite two by two. All the buried conducting lines 73 have both their ends each connected to a contact branch. These said contact branches are located on opposite sides of the array.

If it is considered that the buried conducting lines have no contribution to the parasitic resistance, this situation does not make it possible to have a parasitic resistance lower than in the preceding embodiment.

However, if the buried conducting lines 83 have a contribution to the parasitic resistances, this embodiment of the invention enables the parasitic resistance associated with each diode Di to be reduced with respect to both aforesaid embodiments. Indeed, in this embodiment, each diode Di is connected through four buried conducting lines 83, each in electrical contact with at least one contact branch located in the periphery of the array. By way of comparison, in the preceding embodiment, each diode Di is only connected to the contact branches through two buried conducting lines.

In the invention, if the buried conducting lines do not have a first conductivity according to the meaning of the invention, an arrangement of buried conducting lines 73, 83 according to the third or fourth embodiment of the invention will be preferred, illustrated in FIGS. 7 and 8 respectively. In both these embodiments, each diode Di considered is in close proximity to at least one buried conducting line 73, 83. That is at least one buried conducting line extends between said diode Di and at least one neighbouring diode. In particular, in both these embodiments, it is possible to have two or more buried conducting lines, located in close proximity to each diode.

In the case of the fourth embodiment, illustrated in FIG. 8, each diode Di is in close proximity to four buried conducting lines 83.

Both these embodiments thus enable a higher gain than that calculated from the expression {3} to be obtained. In particular, in the fourth embodiment, all the branches of the peripheral substrate contact 85 are connected to two buried conducting lines located in close proximity to each diode of the array, a buried conducting line being located on either side of said diode. Thus, for each diode, the fourth embodiment amounts to forming a meshing of buried conducting lines 83 according to the third embodiment of the invention but with twice as high a width T. There is thus an effective gain G' higher by a factor 2 to 4 than the gain G strictly calculated according to the relationship {3} in the case where there is a single buried conducting line which extends in close proximity to a diode.

Further, independently from the dopant density used in the buried conducting lines, the third and fourth embodiments of the invention allow an increase stabilisation of the interface between the substrate and the dielectric layer superimposed to the substrate. In the continuation of the description, the references of FIG. 5B will be used, applied to a case where there are several buried conducting lines 53.

As set out above, the presence of doped zones 52$i$ of the different diodes Di, close to the interface between the substrate 51 and the dielectric layer 59 superimposed to the substrate, forms significant charge effects at this interface.

When the buried conducting lines 53 are close to this interface and have a significant doping density, in the same order of magnitude as the doping density in the doped zones of the diodes, or of a higher order of magnitude, a potential barrier is formed at the interface between the substrate and the dielectric layer 59. This is the case for any buried conducting line 53 according to the invention which consists of a doped semi-conductor material, whether degenerate or not. There is thus a decrease in the interactions between minority carriers and recombining states, which is a cause of the interface destabilisation.

Moreover, as set forth previously, the buried conducting lines 53 and the doped zone 52$i$ of the diodes Di have preferably dopings of the opposite type. Thus, the buried conducting lines 53 induce a charge balancing at the interface between the substrate 51 and the dielectric layer 59.

Both these points lead to an interface stabilisation and a screening of the charge effects. This enables reduced space noises, time noises and cycling noises with respect to an array according to the state of the art to be obtained.

In the case of buried conducting lines 53 based on semi-conductor material doped with a line dopant, the higher the width T and the thickness H of the buried conducting line 53, the higher the charge screening and balancing effects. Indeed, the line dopant has a presence at the interface which depends on the dimensions of the buried conducting line 53 as well as the number of buried conducting lines 53 surrounding each diode Di.

In a particular embodiment of the invention, if the substrate is a $Hg_{1-x}Cd_xTe$ based semi-conductor material having a given band gap and a first cadmium composition x, it is advantageous that the buried conducting lines 53 be p+ doped with an acceptor type line dopant, for example arsenic. Indeed, if the dopant present in the buried conducting line 53 is of the acceptor type, it is possible to easily form an composition self-positioned heterostructure wherein the buried conducting lines 53 have a second cadmium composition higher than the first cadmium composition. The substrate surface or the interface between the substrate and the dielectric layer 58 then remains at the first cadmium composition. The band gap in a $Hg_{1-x}Cd_xTe$ material depends on the cadmium composition. Thus, in a device such as described above, the buried conducting lines 53 are of a material having a higher band gap than that of the substrate 51.

The formation of the buried conducting lines 53 having a higher band gap than that of the rest of the substrate 51 enables the charge effects to be reduced while adding a potential barrier which repulses the interface carriers.

An array of diodes the substrate of which is of HgCdTe generally includes a passivation layer, one of the elements of which is cadmium Cd, located between the substrate and the dielectric layer. To obtain a composition self-positioned heterostructure, there should be a passivation layer one of the elements of which is cadmium Cd (not shown), deposited onto the substrate, in contact with any p+ doped zone where the cadmium composition is desired to be increased. Then a diffusion step comprising in particular annealing is performed, for example with a temperature higher than 100° C. for a duration higher than one minute. Then, there is a selective cadmium diffusion, from the passivation layer, into any zone of the substrate 51 in contact with the passivation layer and having a p+ doping. The cadmium concentration and the band gap are thus locally increased in these zones. If only the buried conducting lines are doped with a p+ type doping, the selective diffusion is restricted to a volume defined by the buried conducting lines 53.

Preferably, when a composition heterostructure is formed in the buried conducting lines 53, these are p+ doped and, the doped zones 52$i$ of the diodes Di are n or n+ doped such that only the buried conducting lines have a band gap higher than that of the substrate 51.

If, alternatively, p doped diodes Di are desired without any composition heterostructure and buried conducting lines having a composition self-positioned heterostructure, it is possible to form the passivation layer in CdTe only at the buried conducting lines 53, in contact with the same before carrying out the aforesaid annealing. In other words, a passivation layer is deposited throughout the substrate except directly above the diodes Di so as not to form a composition self-positioned heterostructure at the diodes Di. It will be then necessary to passivate the diodes and the remaining of the substrate with a passivation layer one of the elements of which is cadmium Cd. In this case, the diode contact can typically be manufactured after forming heterostructures in the buried conducting lines 53.

However, if a composition heterostructure is desired to be formed in the doped zones 52$i$ of the diodes, it is possible to use doped zones 52$i$ having a p or p+ doping. It is also possible, for that purpose, to use an array wherein the buried conducting lines 53$i$ and the doped zones 52$i$ have a same doping type. Thus, there is a lower charge balancing at the interface between the substrate and the dielectric layer, the buried conducting lines 53 and the doped zones 52$i$ having a same doping and polarity type.

When buried conducting lines having a first conductivity are used according to the meaning of the invention, it is generally more advantageous to have buried conducting lines 53 of degenerate semi-conductor material rather than of metal. Indeed, metal buried conducting lines 53 cannot result in a local increase in the band gap, nor in the formation of a potential barrier by charge balancing at the interface between the substrate 51 and the dielectric layer 59.

It can even be considered as being more advantageous to have buried conducting lines based on a non-degenerate doped semi-conductor material in place of one or more metals. Indeed, having a lower gain G but obtaining a high reduction in noise thanks to a better stabilisation of the interface can be more advantageous than obtaining a higher gain G on the parasitic resistance but a lower interface stabilisation if metal buried conducting lines 53 are employed.

The line dopant could have been introduced by ion implantation, at a depth close to a desired centre of the cross-section of the buried conducting line 53, followed by an annealing enabling the dopant to be diffused. A particular example is the implantation of arsenic at 500 KeV at an implantation dose of $2.10^{15}$ at/cm$^2$ followed by an annealing at 400° C. for 5 hours.

Alternatively, the line dopant could have been introduced by dopant diffusion in the material of the substrate 51. This can for example be achieved by depositing a resin mask onto the substrate 51. Then the resin mask undergoes a photolithography so as to have openings where it is desired to form buried conducting lines.

The dopant is provided in contact with the substrate through the openings present in the resin mask. Then, a diffusion annealing is carried out so as to diffuse the dopant into the substrate 51 and form the buried conducting lines 53.

The dopant can be provided as gas form or solid form. If the dopant is given as a solid form, it can be a layer of material deposited above the resin mask and into the openings. Such a material is removed following the diffusion annealing.

The invention claimed is:

1. A device, comprising:
    a substrate having a main surface and carrying an array of diodes, organized into rows and columns, and
    a peripheral substrate contact arranged on at least one side of the array of diodes, the substrate having a first doping type and the array of diodes included in the substrate,
    a second doped zone having a second doping type, opposite to the first doping type, and each diode of the array of diodes having a diode contact comprising a head provided on the main surface and a foot connected to the head and penetrating into the second doped zone a distance from the main surface, wherein
    the substrate includes several other doped zones, each forming a buried conducting line, these other doped zones having the first doping type and a greater doping density than that of the substrate,
    the buried conducting lines having a band gap higher than that of the substrate, and the buried conducting lines being electrically connected to the peripheral substrate contact and positioned at a predetermined distance between diode contacts of two neighbouring columns of diodes of the array of diodes and at a predetermined distance between diode contacts of two neighbouring rows of diodes of the array of diodes and crossing at an intersection of a row and a column of the array of diodes such that the buried conducting lines form a meshing of buried conducting lines.

2. The device according to claim 1, wherein the substrate is a semi-conductor material, such as Si or SiC, SiGe or a $Hg_{1-x}Cd_xTe$ based material or is a semi-conductor on insulator type substrate.

3. The device according to claim 2, wherein the substrate is in a semi-conductor material having one or more chemical elements, the buried conducting lines consist of the same chemical element(s) as the semi-conductor material of the substrate and are doped with a doping element, called a line dopant present with a density between $10^{15}$ and $10^{20}$ at/cm$^3$.

4. The device according to claim 3, wherein the buried conducting lines are of degenerate semi-conductor material.

5. The device according to claim 3, wherein the substrate is of a $Hg_{1-x}Cd_xTe$ based material and the line dopant is arsenic or boron as a function of the doping type wanted in the buried conducting lines.

6. The device according to claim 3, wherein the substrate is of a $Hg_{1-x}Cd_xTe$ based material having, between two neighbouring diodes, a first cadmium composition, and wherein the buried conducting lines have a "p"-type doping and have a second cadmium composition higher than the first composition.

7. The device according to claim 1, wherein the buried conducting lines are in the substrate and are flush with the main surface of the substrate on the side where the diodes are present, wherein the main surface can be an interface between the substrate and a dielectric layer covering the diodes and the substrate.

8. The device according to claim 1, wherein the buried conducting lines are buried in the substrate on the side of the main surface of the substrate where the diodes are present, the buried conducting lines being separated from this main surface by a given thickness of material of the substrate, wherein the surface can be an interface between the substrate and a dielectric layer covering the diode and the substrate.

9. The device according to claim 1, wherein the buried conducting lines including a buried conducting line between two neighbouring columns of diodes and/or two neighbouring rows of the array of diodes at least every k columns and/or m rows of the array of diodes, wherein k and m are three, two or one.

10. The device according to claim 1, wherein each buried conducting line of the buried conducting lines, present between two neighbouring rows or between two neighbouring columns of given length, has a length equal to or higher than the length of the columns or the rows.

11. The device according to claim 1, wherein the buried conducting lines have, being defined in a plane containing the diodes, a length and a width, the width being perpendicular to the length and between about 0.5 μm and 5 μm.

12. The device according to claim 1, wherein the buried conducting lines have a thickness, substantially defined along a normal to a plane containing the diodes, between about 0.5 μm and 2 μm.

13. The device according to claim 1, wherein one or several closer substrate contacts are present, electrically contacting at least one buried conducting line and electrically connected to the peripheral substrate contact by electrical connections other than the buried conducting lines, wherein the closer substrate contacts can be inserted between two neighbouring rows and/or neighbouring columns and can be in replacement of a diode.

14. The device according to claim 1, wherein the buried conducting lines penetrate into the substrate a distance from the main surface which is less than the distance at which the foot penetrates into the second doped zone.

* * * * *